(12) United States Patent
Roy et al.

(10) Patent No.: US 6,560,105 B1
(45) Date of Patent: May 6, 2003

(54) COMPOSITE LOW FLOW IMPEDANCE VOLTAGE GUARD FOR ELECTRONIC ASSEMBLIES

(75) Inventors: Apurba Roy, Carlsbad, CA (US); Michael Zimmerman, North Andover, MA (US)

(73) Assignee: di/dt, Inc., Carlsbad, CA (US)

( * ) Notice: Subject to any disclaimer, the term of this patent is extended or adjusted under 35 U.S.C. 154(b) by 0 days.

(21) Appl. No.: 10/134,214

(22) Filed: Apr. 26, 2002

Related U.S. Application Data

(63) Continuation-in-part of application No. 10/000,314, filed on Oct. 23, 2001, now Pat. No. 6,452,796.

(51) Int. Cl.⁷ .............................................. H05K 7/20
(52) U.S. Cl. ...................... 361/690; 361/600; 361/679; 361/715; 361/816; 361/720
(58) Field of Search .................. 361/600, 631, 361/634, 637–639, 644, 647–650, 652, 679, 673, 688, 690, 694–695, 704, 707, 709–710, 715, 719–720, 816, 831

(56) References Cited

U.S. PATENT DOCUMENTS 4,180,955 A * 1/1980 Krstich ........................ 361/679
6,055,155 A * 4/2000 Von Gutfeld ............... 361/690
6,137,689 A * 10/2000 Schechtel et al. ........... 361/816
6,304,458 B1 * 10/2001 Mendolia .................... 361/814

* cited by examiner

Primary Examiner—Gregory Thompson
(74) Attorney, Agent, or Firm—Lowenstein Sandler PC

(57) ABSTRACT

In accordance with the invention, an open frame circuit assembly mounted on a planar substrate is provided with a composite low flow impedance voltage guard. The composite guard comprises an ESD protective cover portion and a clip portion to capture the cover portion and clip to the circuit board. The cover portion comprises a lower frame member extending peripherally around the assembly, an apertured top member overlying the assembly and a plurality of spaced apart struts supporting the top member from the frame. The top member and struts have rounded surfaces to preserve streamlines in air flowing over the assembly, and all openings and spacings are sufficiently small to preclude accidental human contact with the assembly. Large area portions of the cover portion are preferably made of polymer containing conductive fillers for ESD protection. The clip portion is preferably made of high elongation polymer for secure holding and clipping.

11 Claims, 4 Drawing Sheets

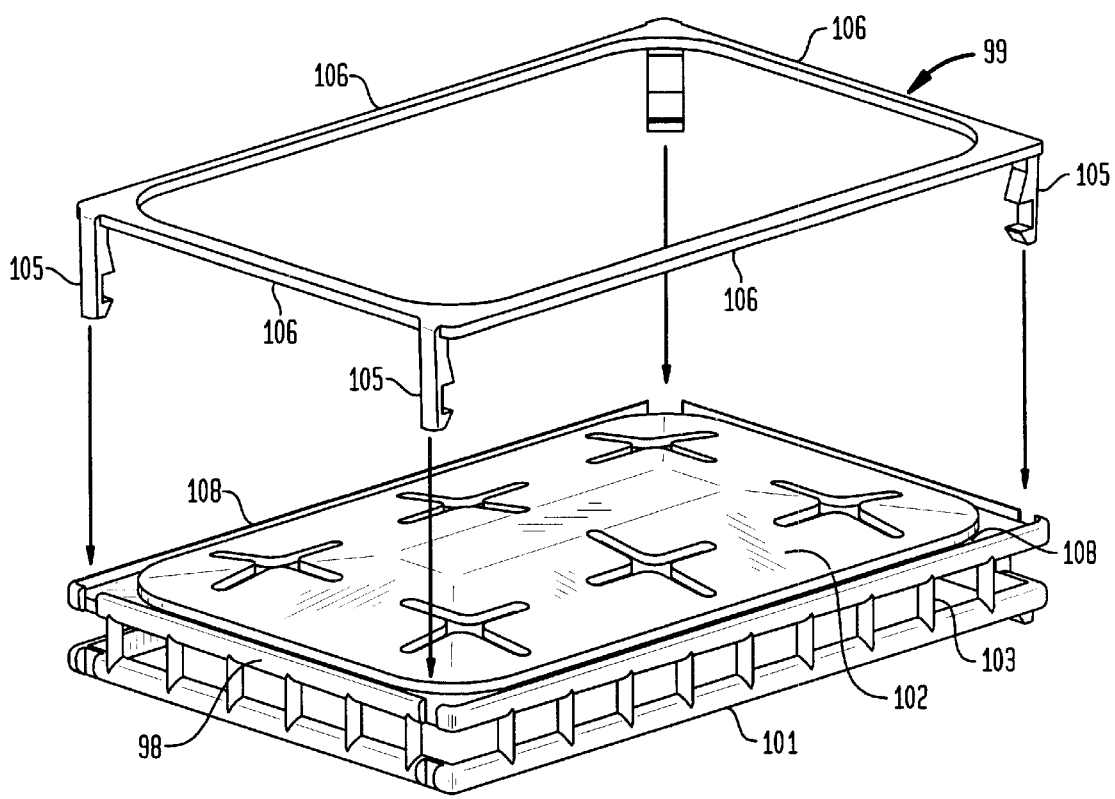

COMPOSITE LOW FLOW IMPEDANCE VOLTAGE GUARD FOR ELECTRONIC ASSEMBLIES

CROSS REFERENCE TO RELATED APPLICATIONS

This application is a continuation-in-part of U.S. patent application Ser. No. 10/000,314 filed by Apurba Roy on Oct. 23, 2001 now U.S. Pat. No. 6,452,796 and entitled "Low Flow Impedance Voltage Guard For Electronic Assemblies." Application Ser. No. 10/000,314 is incorporated herein by reference.

FIELD OF THE INVENTION

This invention relates to electronic assemblies and, in particular, to an electronic assembly provided with a composite low flow impedance voltage guard to prevent electrostatic discharge and protect users from hazardous voltages while facilitating the flow of cooling fluid. The voltage guard can be mounted by pick and place techniques.

BACKGROUND OF THE INVENTION

Open frame electronic assemblies, such as modules or circuit cards, are advantageous over closed frame or covered assemblies in many high power applications. In an open frame assembly, heat generating components such as transformers, resistors and transistors are exposed on the surface of the module or card. Consequently when open frame assemblies are placed in operating environments using moving cooling fluid (e.g. air), the fluid moves in direct contact with the heat generating components. The direct contact permits a high rate of heat transfer from the components to the cooling fluid, enabling higher performance of an open frame assembly as compared with a covered assembly. Thus, for example, an open frame power supply will be able to deliver more power for a given rate of airflow than a closed frame power supply.

Unfortunately, in applications involving assemblies with hazardous voltages, service personnel or users may come into proximity with the assemblies. A hazardous voltage has been defined by pertinent standards (EN60950) as any in-circuit AC voltage over 42.2V (peak) or DC voltage over 60V. In such applications open frame assemblies have the disadvantage that human contact can result in a shock hazard. The shock hazard is typically minimized by disposing the circuitry in a closed frame or covered assembly, but the closed frame or cover blocks or greatly reduces airflow, limiting device and circuit performance.

It is also desirable that the frame or cover should protect nearby voltage-sensitive components, the user, and the ambient environment from electrostatic discharge (ESD). In many applications power components are used in close proximity to low voltage digital circuitry. ESD in such applications can seriously damage such circuitry. Moreover in some hazardous environments ESD can present risk of fire or even explosion.

While there are a variety of frames and covers in use, insofar as is known, none provides ease of cooling, shock prevention and ESD protection in an inexpensive and easily assembled structure. Accordingly there is a need for a new type of voltage guard for an electronic assembly.

SUMMARY OF THE INVENTION

In accordance with the invention, an open frame circuit assembly mounted on a planar substrate is provided with a composite low flow impedance voltage guard. The composite guard comprises an ESD protective cover portion and a clip portion to capture the cover portion and clip to the circuit board. The cover portion comprises a lower frame member extending peripherally around the assembly, an apertured top member overlying the assembly and a plurality of spaced apart struts supporting the top member from the frame. The top member and struts have rounded surfaces to preserve streamlines in air flowing over the assembly, and all openings and spacings are sufficiently small to preclude accidental human contact with the assembly. Large area portions of the cover portion are preferably made of polymer containing conductive fillers for ESD protection. The clip portion is preferably made of high elongation polymer for secure holding and clipping.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 4 is an exploded view showing how the clip member can capture the cover member.

It is to be understood that these drawings are for purposes of illustrating the concepts of the invention and are not necessarily to scale.

DETAILED DESCRIPTION OF THE INVENTION

Figure 1:
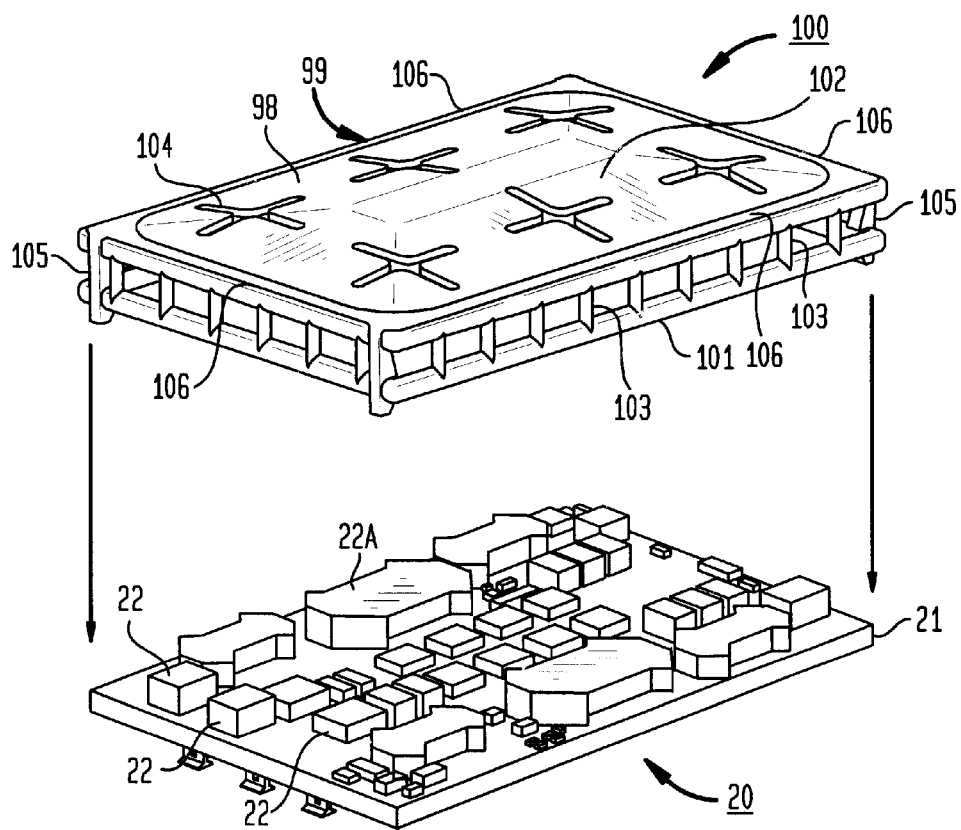
FIG. 1 is a perspective view of a circuit assembly having a composite low flow impedance voltage guard in accordance with the invention.

Referring to the drawings, FIG. 1 is a perspective view of an exemplary composite low flow impedance voltage guard 100 for protecting a circuit assembly 20. The circuit assembly 20 typically comprises a planar substrate 21, upon which are mounted a plurality of circuit components 22 which may include high voltage components 22A presenting a voltage hazard or generating charged particles which can accumulate to present an ESD hazard. The assembly 20, in turn, may be mounted on a larger planar system board (not shown) as part of a larger electronic system.

The composite low flow impedance voltage guard 100 comprises in essence, an ESD protective cover portion 98 and a clip portion 99. The cover portion 98 includes a lower frame member 101 extending peripherally around the edges of assembly substrate 21. A top member 102 overlies the assembly 20 and is supported from lower frame 101 by a plurality of spaced apart struts 103. The top member 102 has an aerodynamic shape (concave or convex) and includes one or more apertures 104 to permit heated air to flow from the assembly 20. The apertures 104 are preferably cruciform in shape to prevent human contact with the assembly while providing a relatively large area opening. The exterior and interior edges of the lower frame 101, the top 102 and the struts 103 are advantageously all aerodynamically rounded to promote laminar flow of cooling air and thereby provide low impedance to fluid flow through and over the voltage guard. The terms "aerodynamic shape" and "aerodynamically rounded" as used herein refer to streamlined shapes which preserve streamlines in laminar flow, minimize drag and minimize turbulence in wake. See Raymond Binder, *Fluid Mechanics* 5$^{th}$ ed., pp. 45 and 130–131 (Prentice Hall, 1973).

The clip portion 99 is secured to the cover portion 98. It provides a plurality of snap tabs 105 for attaching the guard 100 over and peripherally around the exposed portion of assembly 20. The snap tabs 105 can latch onto the lower frame 101 and fit into the substrate 21. The snap tabs 105 are interconnected by a frame portion 106. Advantageously, the frame portion 106 is configured to physically capture the top member 102 of the cover. Preferably the frame extends around the periphery of top member 102. Since circuit assemblies 20 are typically formed on rectangular substrates 21, the voltage guard 100 is typically of rectangular form.

Figure 2:
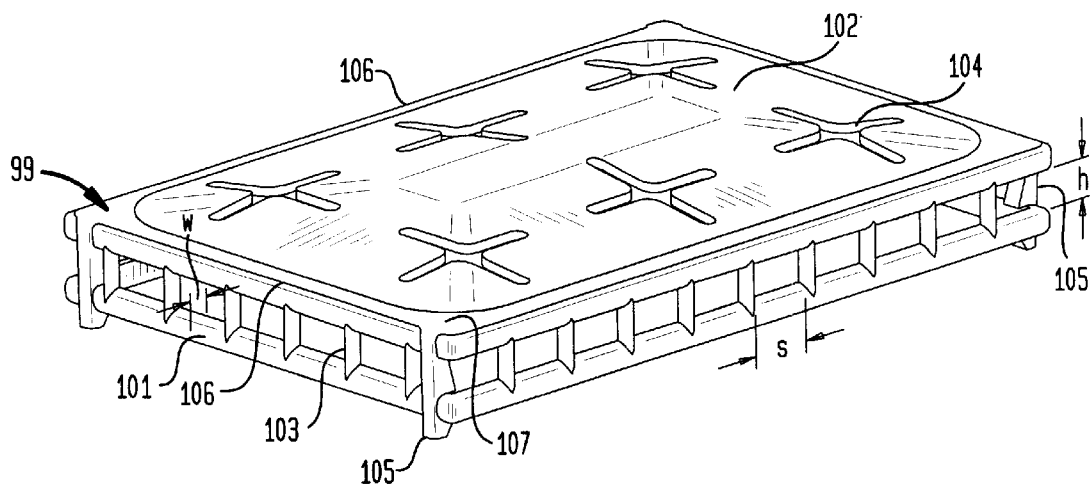
FIG. 2 is a perspective view of the voltage guard of FIG. 1.

Further features and details of the voltage guard 100 can be seen by reference to the partially schematic perspective view of FIG. 2. As can be seen, the top 102 is advantageously reinforced by internal vanes 107 extending from each top corner toward the central portion of the top. The dimensions of the guard 100 are chosen to preclude human contact with the hazardous voltage components and circuitry of assembly 20. (Preclusion of human contact is defined by pertinent regulations (IEC 60950 or UL 1950) as preclusion of contact by a human finger. This can be tested by a model human finger prescribed in JFP10.) To accomplish this, strut height h and spacing s can be chosen in relation to the width w of the frame, where w is the horizontal dimension of the rounded frame bar cross section. Generally h should be less than about $2\sqrt{w(0.168-w)}$ and s should be less than about $2\sqrt{w(0.322-w)}$, where all dimensions are in inches. For the case where lower frame 101 has a cross sectional width of about 0.050 in., strut height h should be h≦0.154 in. and spacing s between struts should be s≦0.233 inch. In all cases h should be less than about 0.168" and s should be less than 0.322". In instances where a greater strut height h is required, a second frame can be formed intermediate the vertical ends of the struts so that the strut height preclusion condition is met.

The cover portion 98 and the clip portion 99 are advantageously made of different materials (hence the term "composite" voltage guard). The cover portion, encompassing the relatively large area top portion 102, is preferably an ESD safe material. ESD safe materials typically have a surface resistance greater than $1.0 \times 10^4$ ohms per square but less than or equal to about $1.0 \times 10^{11}$ ohms per square when tested according to EOS/ESD—S11.11 or a volume resistivity greater than $1.0 \times 10^5$ ohm-cm but less than or equal to $1.0 \times 10^{12}$ ohm-cm when tested according to the methods of EIA 541. A preferred ESD safe material is a polymer including a conductive filler such as graphite fibers or metallic particles. The polymer itself should have good resistance to heat, chemicals and flame and should be moldable into thin and complex shapes. A preferred polymer is a liquid crystal polymer marketed by Ticona Inc., USA. The polymer can be compounded with a high percentage of conductive fillers to achieve ESD safe protection. Typically the inclusion of conductive fillers produces a brittle (low elongation) material (elongation typically about 1.5%) which precludes desirable snap-on features useful in pick-and-place assembly.

To permit snap on assembly, the clip portion 99 is advantageously made of a polymer having a higher elongation than the ESD safe material that will permit the molding of reliable snap-tabs for securing the cover to the PCB. Advantageously the polymer has an elongation in the range 5% to 10%. The polymer should also have good resistance to heat and chemicals. A preferred polymer is polyetherimide (elongation about 6%).

Figure 3A:
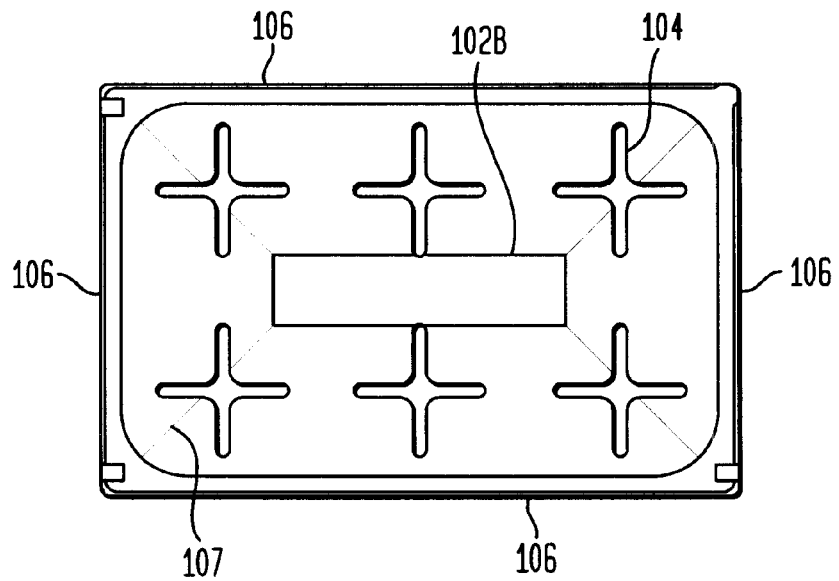
FIGS. 3A, 3B and 3C are top, side and end views of the voltage guard of FIG. 1.
Figure 3B:
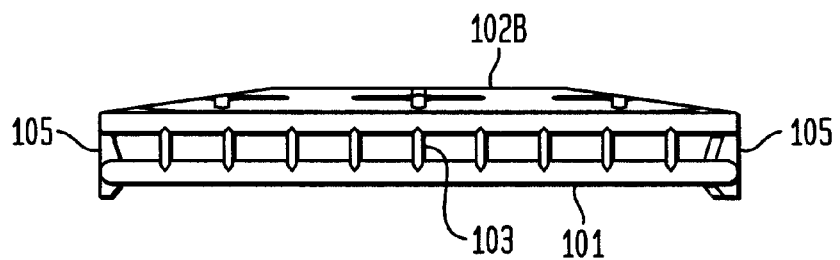
Figure 3C:
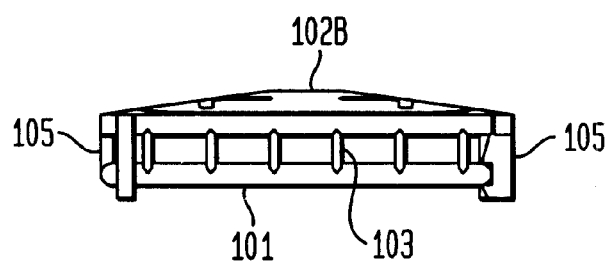

FIGS. 3A, 3B and 3C are schematic top, side and end views, respectively, of the voltage guard 100 depicted in FIGS. 1 and 2. The top 102 slopes vertically outwardly to a vertically extended central portion 102B. This provides a convex aerodynamic surface 102B.

FIG. 4 is an exploded view useful in understanding how the clip member 99 can capture the cover member 98. In this embodiment, the cover membrane 98 has a recessed groove 108 extending around the peripheral region of top member 102. The clip member 99, in turn, has a frame member 106 shaped to fit within groove 108 peripherally around the top member. In addition, snap tabs 105 can snap on to lower frame 101. Advantageously the snap tabs 105 extend below lower frame 101 for snap on to and capture of PC board 20 (not shown).

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. An electronic assembly including a voltage guard to prevent human contact with hazardous voltages comprising:

an electronic assembly comprising a substrate and one or more hazardous voltage electronic components mounted on the substrate; and secured over the assembly a composite voltage guard comprising a cover portion comprising ESD safe material comprising a polymer of a first elongation and a clip portion comprising a polymer of a second elongation higher than the first, the cover portion comprising a lower frame member extending peripherally around the assembly, a top member having one or more apertures overlying the assembly and a plurality of spaced apart struts supporting the top member from the frame, the dimensions of the one or more apertures, the spacing between the struts and the height of the struts sufficiently small to prevent human contact with the hazardous voltage components and the edges of the struts and frame rounded to minimize impedance to fluid flow through the voltage guard, and the clip portion comprising a frame portion and a plurality of snap tabs.

2. The assembly of claim 1 wherein the frame portion of the clip extends around a peripheral region of the top member.

3. The assembly of claim 1 wherein the clip portion comprises a material having elongation in the range 5% to 10%.

4. The assembly of claim 1 wherein the top member has a recessed peripheral region and the frame portion is shaped to fit into the recessed peripheral region.

5. The assembly of claim 1 wherein the top member has an upper surface shaped to preserve streamlines in fluid flowing over the assembly.

6. The assembly of claim 5 wherein the top member has a concave upper surface with a central region recessed toward the substrate.

7. The assembly of claim 5 wherein the top member has a convex upper surface with a central region displaced away from the substrate.

8. The assembly of claim 1 wherein one or more apertures in the top member have a cruciform shape.

9. The assembly of claim 1 wherein the frame member has a cross sectional width w and the height h of the struts between the frame and the top member is $h \leq 2\sqrt{w(0.168-w)}$, h and w measured in inches.

10. The assembly of claim 1 wherein the frame member has a cross sectional width w and the spacing s between successive struts is $s \leq 2\sqrt{w(0.322-w)}$, s and w measured in inches.

11. The assembly of claim 1 wherein the lower frame member is attached to the substrate.

* * * * *